United States Patent
Lin et al.

(10) Patent No.: US 7,682,903 B1
(45) Date of Patent: Mar. 23, 2010

(54) METHOD OF FORMING A POWER DEVICE

(75) Inventors: Wei-Chieh Lin, Hsinchu (TW); Hsin-Yu Hsu, Chiayi County (TW); Hsin-Yen Chiu, Taichung County (TW); Shih-Chieh Hung, Changhua County (TW); Ho-Tai Chen, Taipei County (TW); Jen-Hao Yeh, Kaohsiung County (TW); Li-Cheng Lin, Taipei (TW)

(73) Assignee: Anpec Electronics Corporation, Hsin-Chu (TW)

( * ) Notice: Subject to any disclaimer, the term of this patent is extended or adjusted under 35 U.S.C. 154(b) by 0 days.

(21) Appl. No.: 12/334,492

(22) Filed: Dec. 14, 2008

(30) Foreign Application Priority Data

Sep. 4, 2008  (TW) ............................. 97133886 A

(51) Int. Cl.
*H01L 21/336* (2006.01)
(52) U.S. Cl. ................ 438/259; 438/270; 257/E21.655
(58) Field of Classification Search ................ 438/259, 438/270, 271, 589; 257/E21.655
See application file for complete search history.

(56) References Cited

U.S. PATENT DOCUMENTS 7,084,457 B2 * 8/2006 Hsieh et al. ................ 257/329

* cited by examiner

*Primary Examiner*—Hoai v Pham
(74) *Attorney, Agent, or Firm*—Winston Hsu

(57) ABSTRACT

A method of forming a power device includes providing a substrate, a semiconductor layer having at least a trench and being disposed on the substrate, a gate insulating layer covering the semiconductor layer, and a conductive material disposed in the trench, performing an ion implantation process to from a body layer, performing a tilted ion implantation process to from a heavy doped region, forming a first dielectric layer overall, performing a chemical mechanical polishing process until the body layer disposed under the heavy doped region is exposed to form source regions on the opposite sides of the trench, and forming a source trace directly covering the source regions disposed on the opposite sides of the trench.

11 Claims, 11 Drawing Sheets

METHOD OF FORMING A POWER DEVICE

BACKGROUND OF THE INVENTION

1. Field of the Invention

The present invention relates to a method for manufacturing a power device, and more particularly, to a method for manufacturing a trench power device capable of increasing the channel density of MOS devices.

2. Description of the Prior Art

Power devices are typical semiconductor devices in power management applications, such as a switching power supply, a power control IC of a computer system or peripherals, a power supply of a backlight, motor controller, etc. Power devices can be various kinds of transistors, such as an insulated gate bipolar transistor (IGBT), a metal-oxide-semiconductor field effect transistor (MOSFET) and a bipolar junction transistor (BJT). With advantages of fewer power-consumption and faster switching-speed, the MOSFETs are widely adopted in various arts.

Furthermore, developments of trench MOSFETs become an important tendency, because trench MOSFETs can provide a lower electric resistance in conduction and a smaller device dimension, and can effectively control voltages with the fewer power-consumption.

As shown in FIG. 1, a trench power MOSFET 10 includes a substrate 12. An N-type light (N−) doped semiconductor layer 14 is formed in the substrate 12 by epitaxy. Subsequently, a first part 16 of a trench, a plurality of second parts 18 of the trench, a P-type body layer 20 and a plurality of N-type heavy (N+) doped the source regions 22 are formed in the semiconductor layer 14. The power device further includes a dielectric layer 24 and a metal layer 26 disposed on the semiconductor layer 14 in order. The dielectric layer 24 has a plurality of the contact plugs 28 and 30 therein for electrically connecting the metal layer 26 and the underlying trench power MOSFET 10. A gate oxide layer 32 is disposed on the top surface of the semiconductor layer 14, and sidewalls and bottoms of the first and second parts 16 and 18 of the trench. In addition, a poly-silicon material 34 fills the first and second parts 16 and 18 of the trench, and function as the gate of the trench power MOSFET 10. The semiconductor layer 14 further includes an insulating ring (not shown in the drawings) therein. The insulating ring surrounds the trench power MOSFET 10 for electrically isolating the trench power MOSFET 10 from other devices or elements, and for defining the position of the active region.

The desire for ever more compact electronic devices has pushed for size reductions in integrated circuits. Therefore, higher integrations and higher densities are developed continuously. However, the layout design for the prior trench power MOSFET 10 structure already has its established design rules. For example, one of the design rules is that the distance between the contact plug 30 and the near second part 18 of the trench must be larger than a predetermined value to ensure the normal performance of the trench power MOSFET 10, and to reserve spaces for an allowable misalignment of lithography processes. As a result, the distance between the adjacent second parts 18 of the trench is limited by the design rules of the trench power MOSFET 10, and therefore cannot be reduced boundlessly. For instance, the designed width of each second part 18 of the trench is larger than 0.3 micrometer, and the designed distance between the adjacent second parts 18 of the trench is larger than 1.0 micrometer in the design rules. However, the design rules for ensuring the performance therefore restricts device integrations and channel densities of the trench power MOSFET 10, and limits the development of the trench power MOSFET 10.

SUMMARY OF THE INVENTION

It is therefore an objective of the present invention to provide a method for forming a power device for increasing the channel density and the device integration of the trench power MOSFET, and solving the above-mentioned problems.

According to the present invention, a method for forming a power device is provided. First, a substrate, a semiconductor layer having a trench and disposed on the substrate, a gate insulating layer covering the semiconductor layer, and a conductive material disposed in the trench are provided. The substrate defines a cell region and a plug-contacting region thereon. The trench extends from the cell region into the plug-contacting region. A top surface of the conductive material is disposed in a predetermined depth of the trench. Subsequently, an ion implantation process is performed to form a body layer in the semiconductor layer. Next, at least a tilted ion implantation process is performed to form at least a heavy doped region. The heavy doped region contacts a sidewall of the trench, and is disposed in the semiconductor layer. Furthermore, a first dielectric layer is overall formed on the substrate to fill the trench. Next, a chemical mechanical polishing (CMP) process is performed, until exposing the body layer disposed under the heavy doped region, so as to turn the heavy doped region contacting the sidewall of the trench into a plurality of source regions. Following that, a patterned dielectric layer is formed in the plug-contacting region. Thereafter, at least a contact plug is formed. The contact plug penetrates through the patterned dielectric layer and the first dielectric layer, and is electrically connected to the conductive material filling in the trench. Next, at least a gate trace and at least a source trace are formed. The gate trace covers the contact plug, and the source trace covers the source regions disposed in the cell region.

These and other objectives of the present invention will no doubt become obvious to those of ordinary skill in the art after reading the following detailed description of the preferred embodiment that is illustrated in the various figures and drawings.

DETAILED DESCRIPTION

Figure 8:
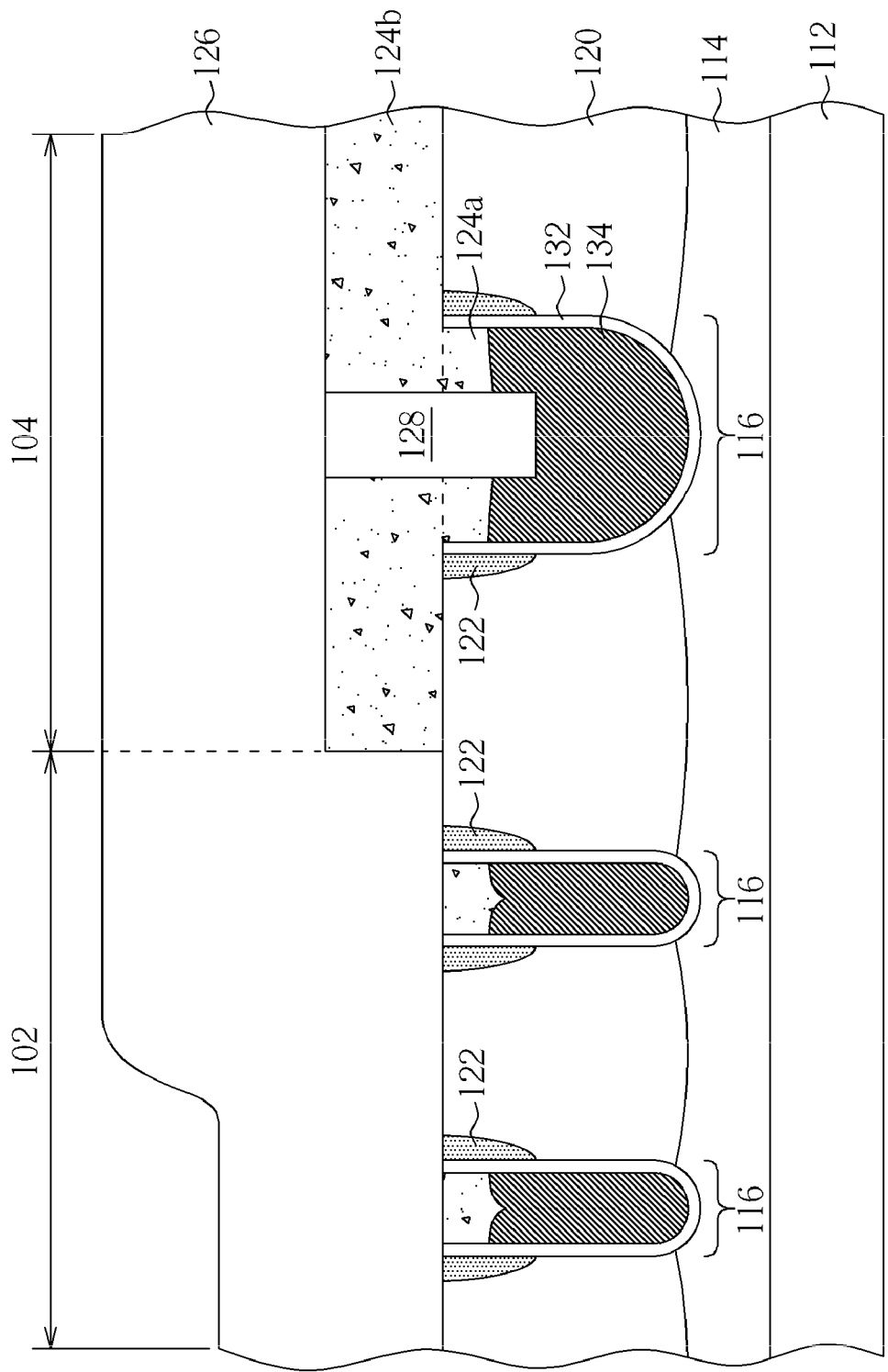
Figure 9:
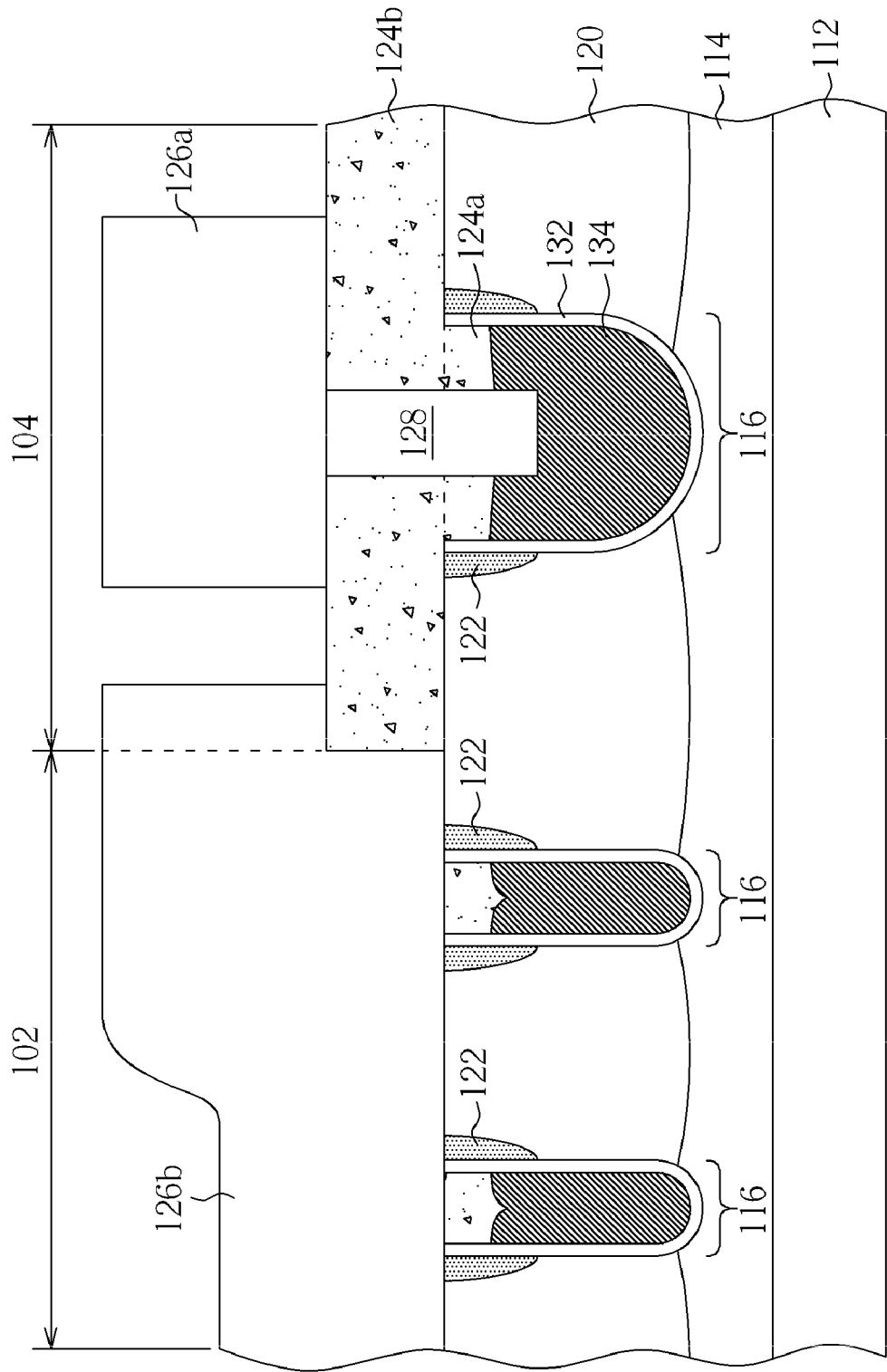
Figure 10:
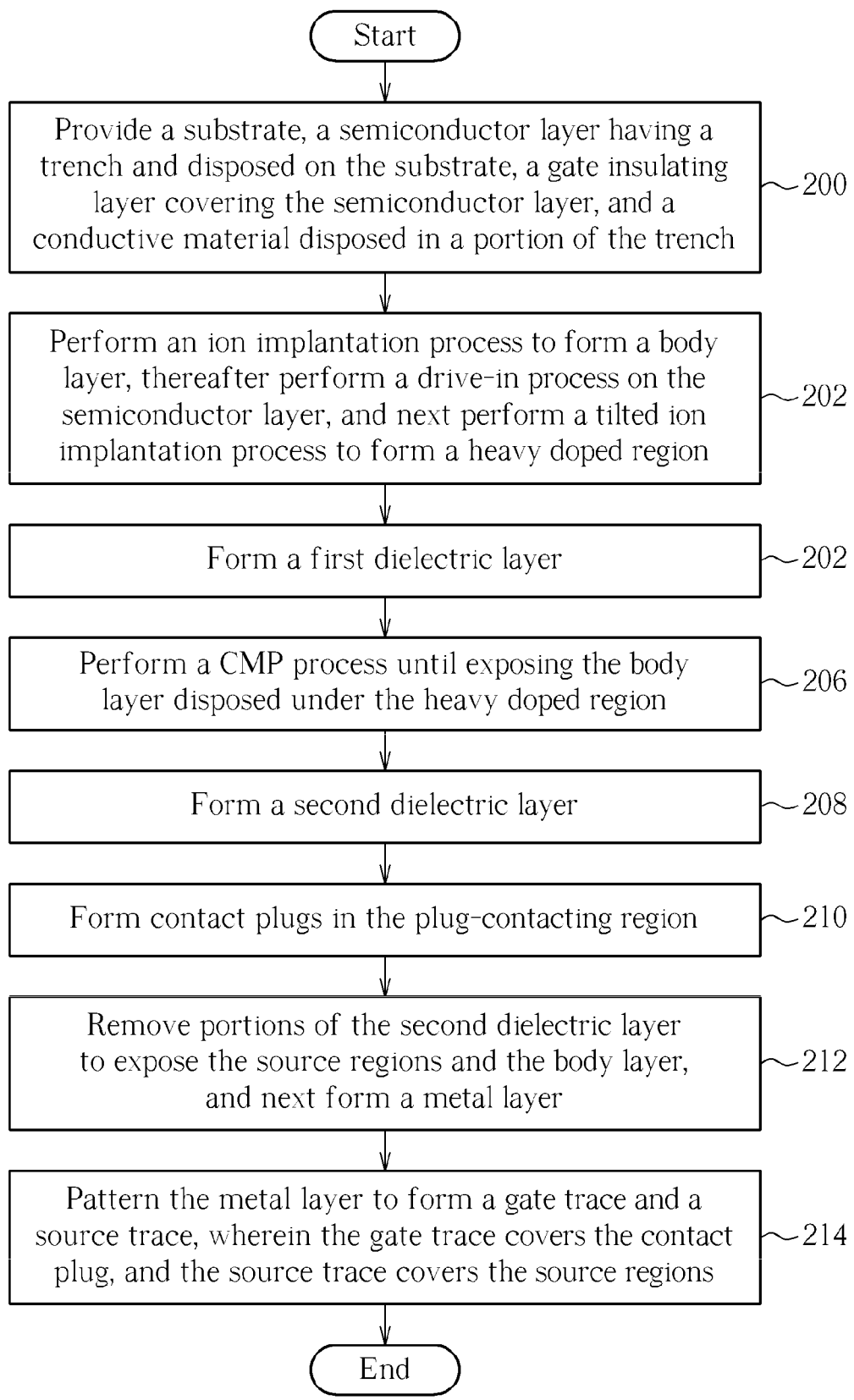
FIG. 10 is a flow chart illustrating the method for forming the power device according to FIG. 2 through FIG. 9.

Please refer to FIG. 2 through FIG. 10. FIG. 2 through FIG. 9 are schematic diagrams illustrating a method for forming a power device according to a preferred embodiment of the present invention, and FIG. 10 is a flow chart illustrating the above-mentioned embodiment, where like numbered numerals designate similar or the same parts, regions or elements. The formed power device can include the trench power MOSFET. It is to be understood that the drawings are not drawn to scale and are served only for illustration purposes.

Figure 1:
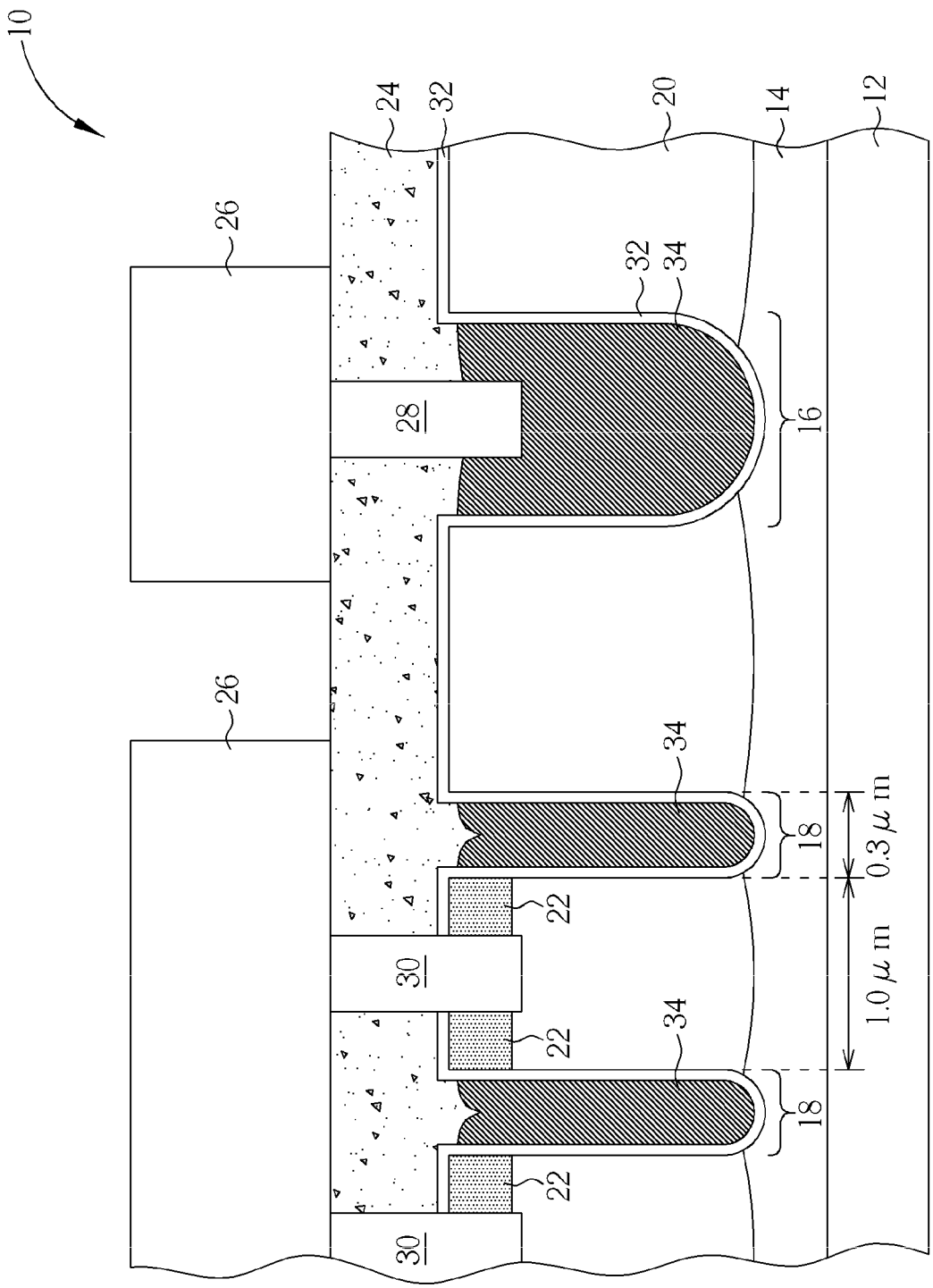
FIG. 1 is a schematic diagram illustrating a prior art trench power MOSFET.
Figure 2:
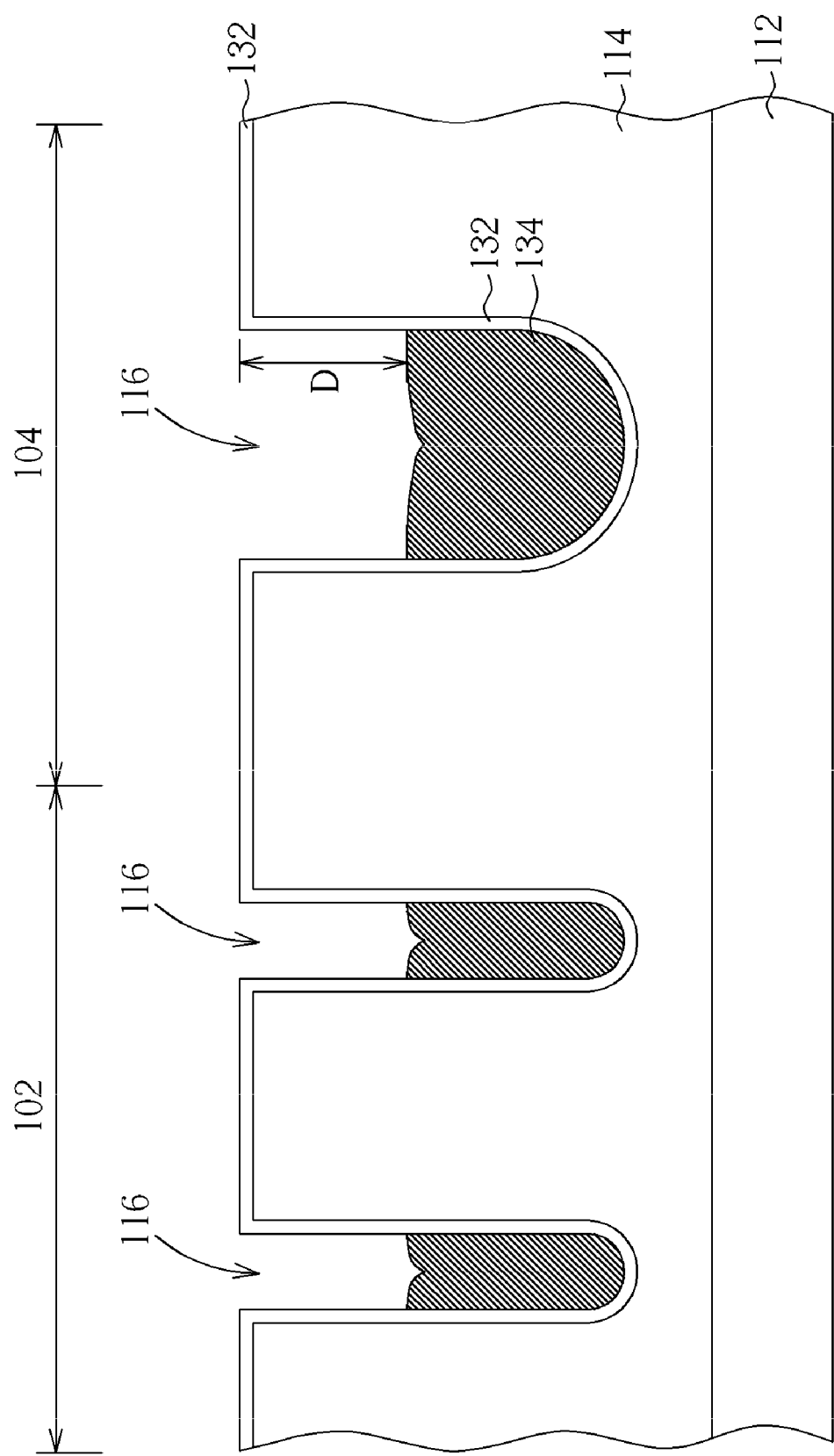
FIG. 2 through FIG. 9 are schematic diagrams illustrating a method for forming a power device according to a preferred embodiment of the present invention.

As shown in FIG. 2 and the step 200 of FIG. 10, a substrate 112 is first provided. The substrate 112 can include silicon substrate, such as a N+ doped substrate or a P+ doped substrate. The substrate 112 defines a cell region 102 and a plug-contacting region 104 thereon. The cell region 102 and the plug-contacting region 104 can construct an active region. Subsequently, a semiconductor layer 114 is formed in the substrate 112 by epitaxy. Taking N-type MOS (NMOS) as an example, an N-type light doped epitaxial silicon layer can be formed as the semiconductor layer 114 by a chemical vapor deposition process, and the semiconductor layer 114 can be the drain region of the formed MOS.

Thereafter, a trench 116 is formed in the semiconductor layer 114 by pattern-transferring process. For instance, steps of forming the trench 116 can include coating a photoresist (not shown in the drawings) on the semiconductor layer 114, next performing a lithograph process on the photoresist by utilizing a photo mask having a trench pattern, then performing an anisotropic etching process on the semiconductor layer 114 to form the trench 116 by utilizing the patterned photoresist as an etching mask, and afterward removing the patterned photoresist. In other case, a patterned hard mask (not shown) can be formed on the semiconductor layer 114, and an anisotropic etching process can be performed on the semiconductor layer 114 to form the trench 116 by utilizing the patterned hard mask as an etching mask.

The trench 116 can extend from the cell region 102 to the plug-contacting region 104 in a vertical view. In other words, the first portion of the trench 116 is disposed in the plug-contacting region 104; the second portion of the trench 116 is disposed in the cell region 102; and the first portion and the second portion can be connected with or contact each other. Only two transistor cells of the trench 116 are illustrated in FIG. 2 for clearly showing the power device structure. However, features of the trench, such as shape, position, depth, width, length and amount, should not be limited to the trench 116 shown in FIG. 2, and can be adjusted according to the product designs or the characteristics of processes in the present invention. For example, the layout pattern of the trench 116 can has strip pattern, finger pattern, spiral pattern and/or the similar.

Furthermore, a gate insulating layer 132 can be formed overall on the semiconductor layer 114 by deposition process or oxidation process, and the gate insulating layer 132 can cover the sidewall and bottom of the trench 116. Following that, a conductive material 134 can be formed on the gate insulating layer 132, and fills the trench 116. Next, an etching back process is performed on the conductive material 134, until the top surface of the conductive material 134 reaches the predetermined depth D of the trench 116, and portions of the gate insulating layer 132 are exposed. In this embodiment, the predetermined depth D can be in a range substantially between 0.4 micrometer and 0.5 micrometer for the etching back process, but not limited thereto. The gate insulating layer 132 can include silicon oxide compounds, and the conductive material 134 can include doped poly-silicon).

Figure 3:
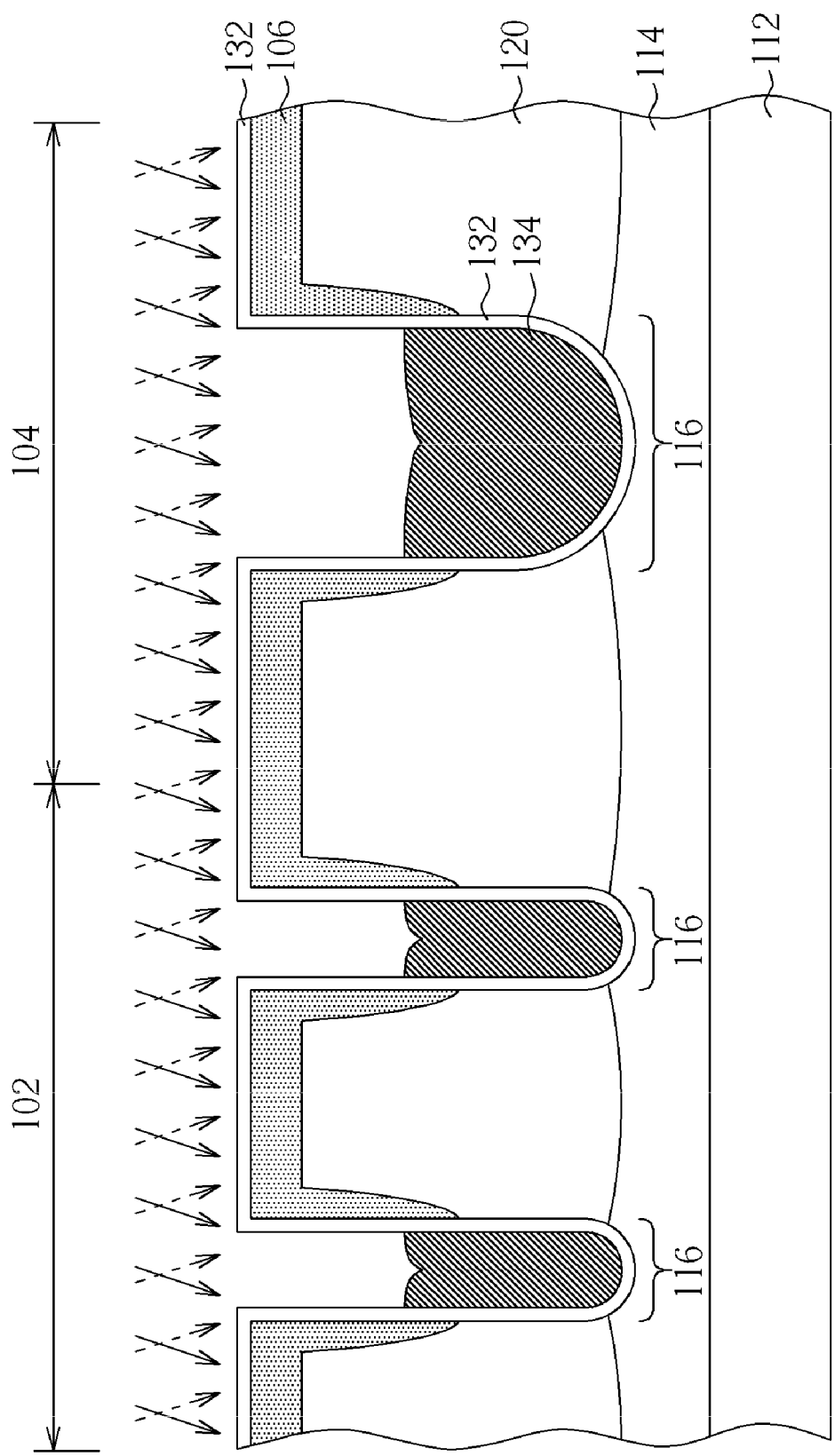

As shown in FIG. 3 and the step 202 of FIG. 10, an ion implantation process can be performed to form a body layer 120, such as a P-type body layer, in the semiconductor layer 114 by utilizing an implanting mask. The body layer 120 can contact the sidewall of the trench 116. Next, a drive-in process can be performed on the semiconductor layer 114. The implanting mask of the ion implantation process (not shown) can cover portions of the semiconductor layer 114 surrounding both the cell region 102 and the plug-contacting region 104, and to expose portions of the semiconductor layer 114 disposed within the cell region 102 and portions of the semiconductor layer 114 disposed within the plug-contacting region 104, so as to define the position of the active region. Accordingly, the portions of the semiconductor layer 114, which are not P-type doped, surrounding the body layer 120 can be an isolating structure to electrically isolate the power device from other devices. Thus, steps of forming insulating rings can be omitted in the present invention, and the process complexity can be simplified.

Thereafter, at least a self-aligned tilted ion implantation process is performed to form at least a heavy doped region 106, such as an N-type heavy doped region, in the semiconductor layer 114. Since the heavy doped region 106 is formed by the self-aligned tilted ion implantation process, the heavy doped region 106 can be accurately formed and highly concentrated on partial sidewalls of the trench 116, and can have a sharp shape in a cross-section shown in FIG. 3. It is preferred that no anneal process is performed in this embodiment after the tilted ion implantation process forms the heavy doped region, so as to prevent the dopant from over diffusion, and to maintain the sharp shape of the heavy doped region 106 for increasing the channel density.

Figure 4:
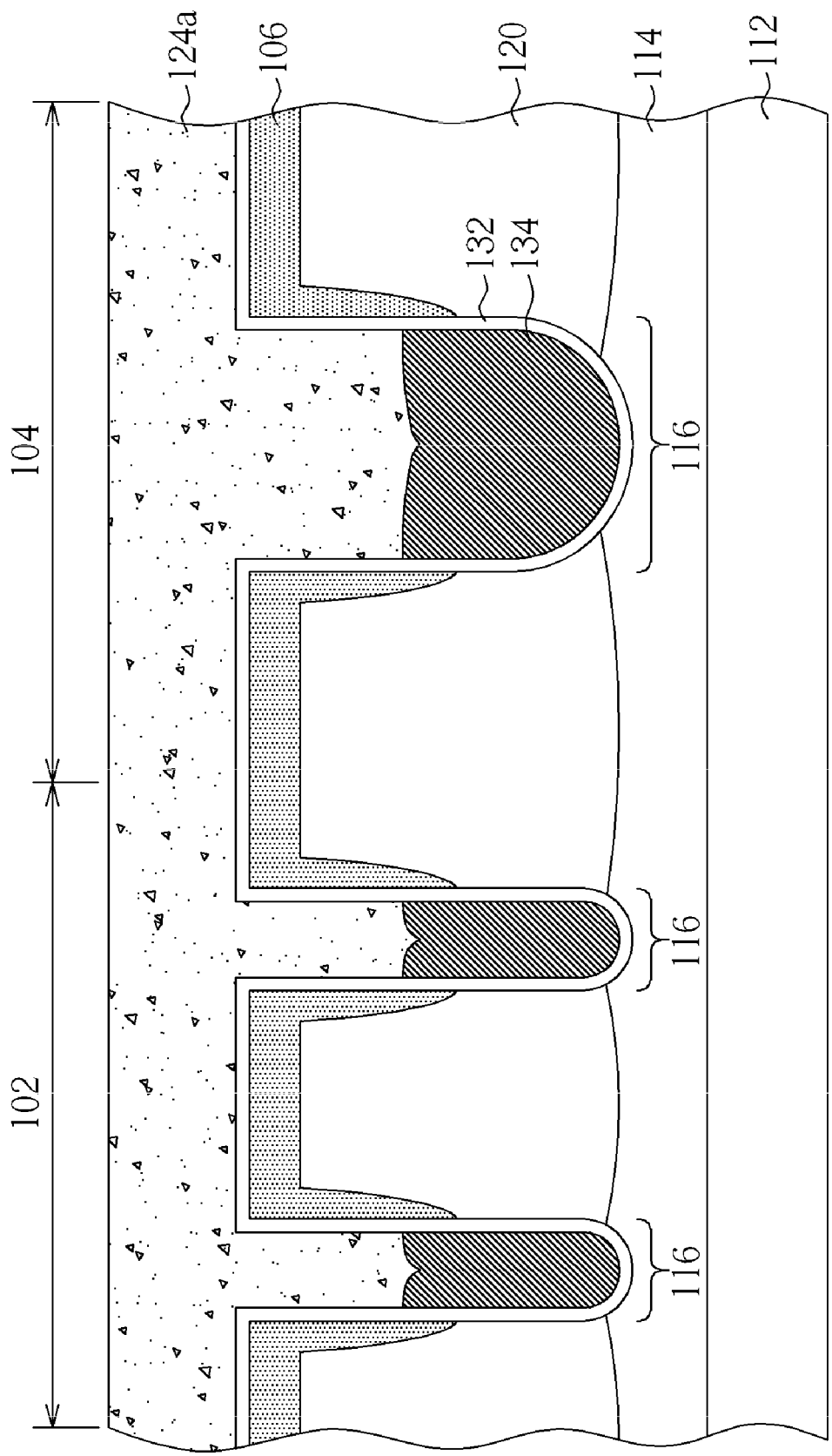

As shown in FIG. 4 and the step 204 of FIG. 10, a first dielectric layer 124a is next formed overall on the gate insulating layer 132, and fills the trench 116. The first dielectric layer 124a can include dielectric materials, such as borosilicate glass (BSG), phosphosilicate glass (PSG), borophosphosilicate glass (BPSG), undoped silicate glass (USG) or fluorosilicate glass (FSG).

Figure 5:
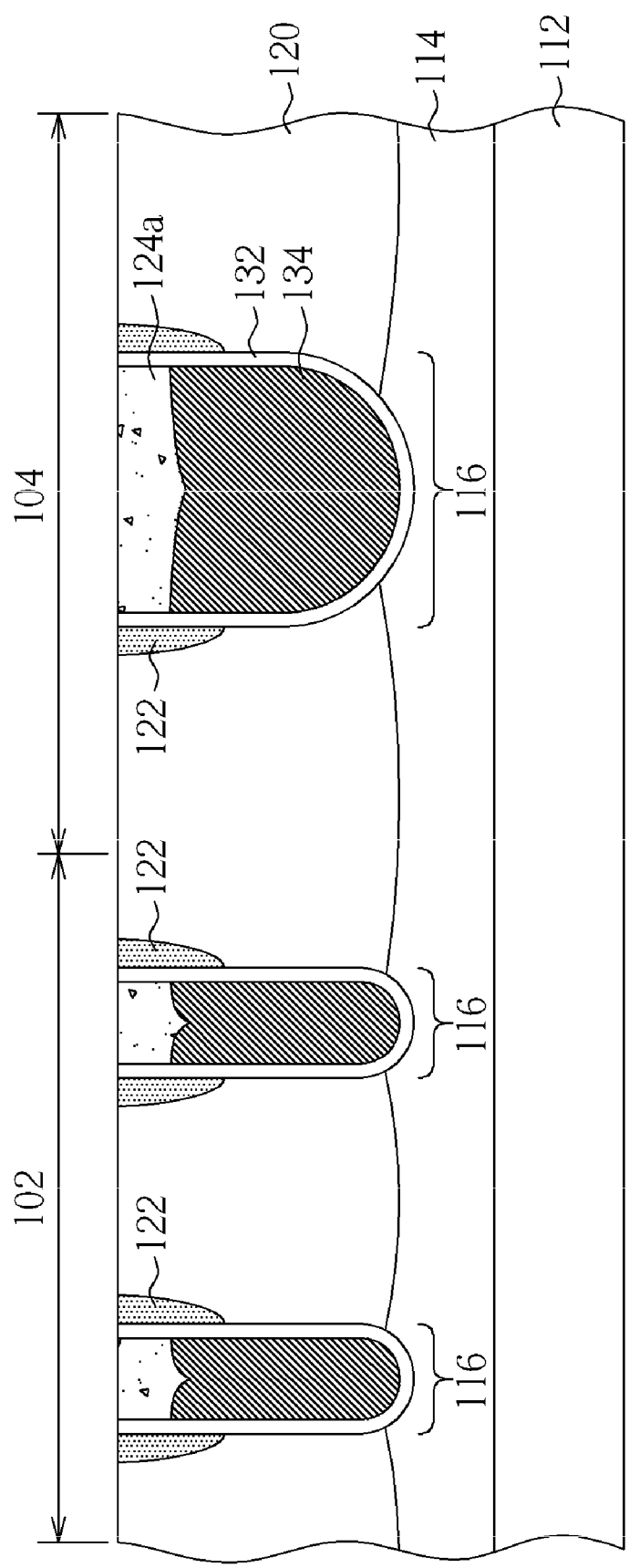

As shown in FIG. 5 and the step 206 of FIG. 10, a chemical mechanical polishing (CMP) process can be performed, until exposing the body layer 120 disposed under the heavy doped region 106, so as to turn the heavy doped region 106 contacting the sidewall of the trench 116 into a plurality of source regions 122.

Figure 6:
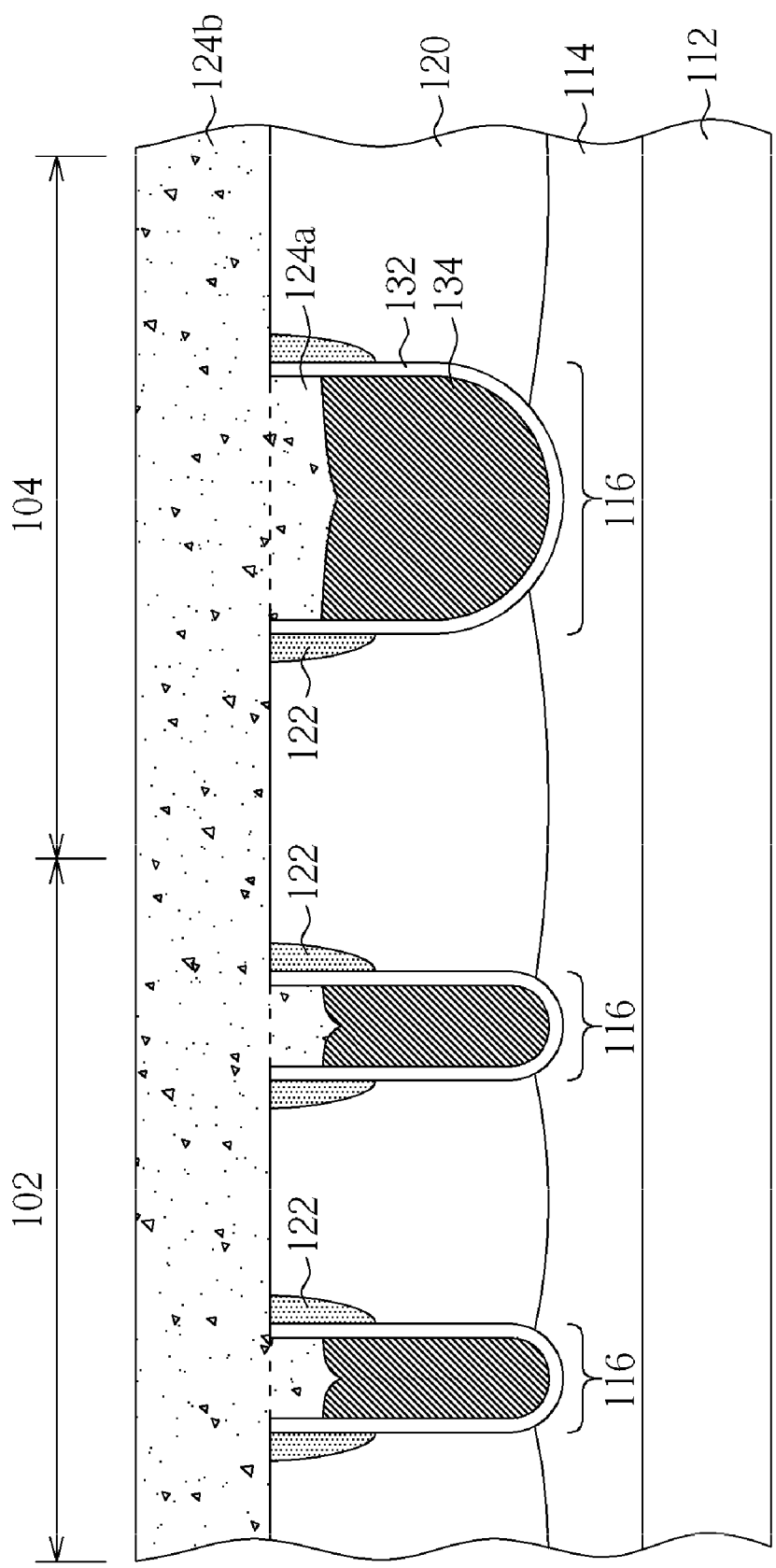

Thereafter, as shown in FIG. 6 and the step 208 of FIG. 10, a second dielectric layer 124b is overall formed to cover surfaces of the body layer 120, the first dielectric layer 124a and the source regions 122. The second dielectric layer 124b can include dielectric materials, such as BSG, PSG, BPSG, USG or FSG.

Figure 7:
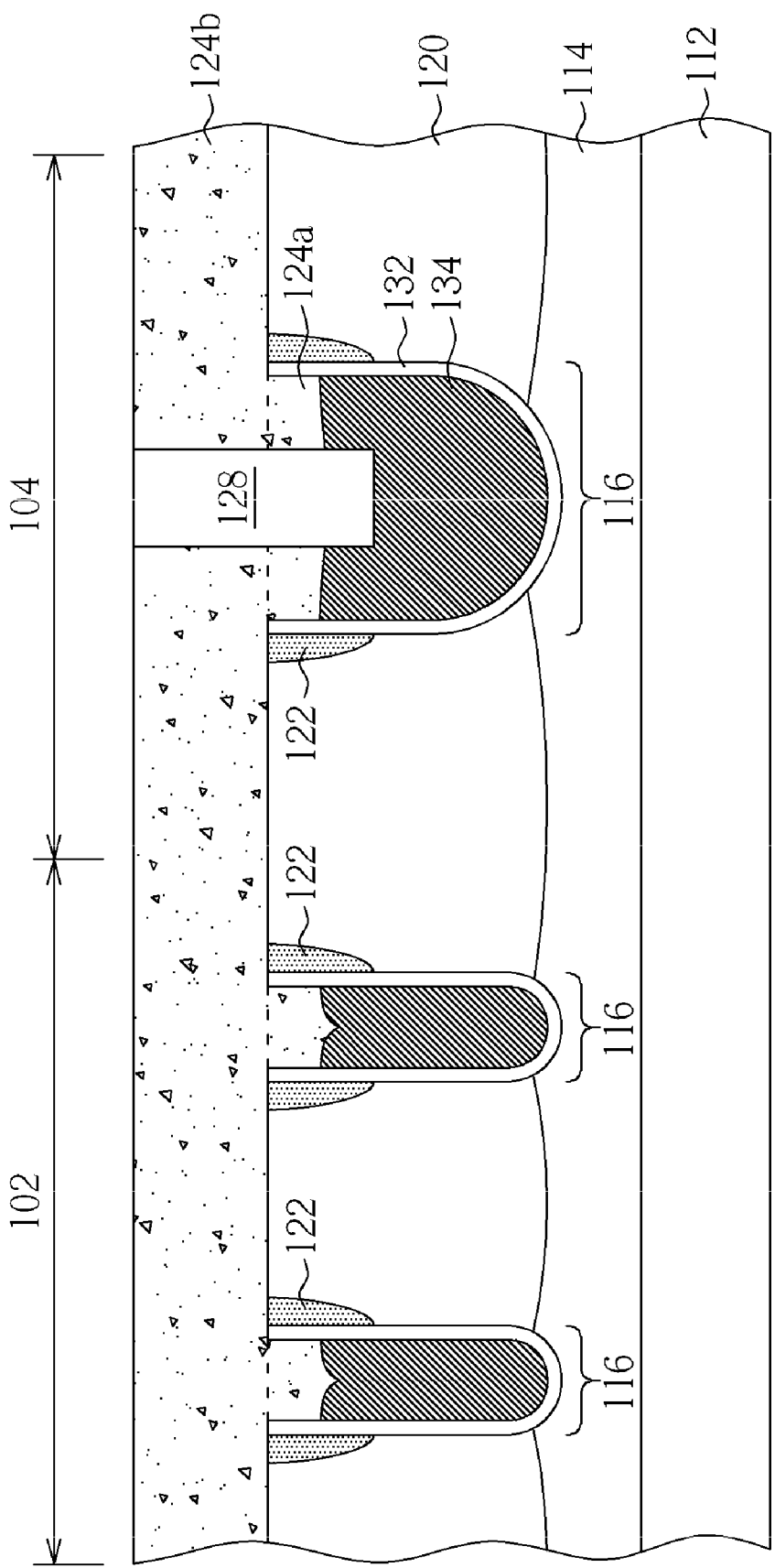

As shown in FIG. 7 and the step 210 of FIG. 10, at least a contact plug 128 can be formed in the plug-contacting region 104 by a damascene process. The contact plug 128 can penetrate through the second dielectric layer 124b and the first dielectric layer 124a, and is electrically connected to the conductive material 134 in the trench 116. For instance, steps of forming the contact plug 128 can include coating a photoresist (not shown) on the second dielectric layer 124b first, next performing a lithograph process on the photoresist by utilizing a photo mask having a plug pattern, afterward performing an anisotropic etching process on the second dielectric layer 124b to form a contact hole by utilizing the patterned photoresist as an etching mask, then filling the contact hole with metal material, and next removing the unnecessary portions of the metal material and substantially the whole patterned photoresist by a CMP process.

In other case, a patterned hard mask (not shown) can be formed on the second dielectric layer 124b, an etching process can be performed on the second dielectric layer 124b to form the contact hole by utilizing the patterned hard mask as an etching mask, the contact hole is filled with metal material, and next the unnecessary portions of the metal material and substantially the whole patterned photoresist are removed by a CMP process. The metal material filling the contact hole can include any conductive materials, such as tungsten (W) or copper (Cu), and a glue layer and/or a barrier layer can be formed in the contact hole before the metal material fills the contact hole.

As shown in FIG. 8 and the step 212 of FIG. 10, portions of the second dielectric layer 124b, which are disposed in the cell region 102, are removed by a pattern-transferring process to expose the source regions 122 and the body layer 120, and to keep portions of the second dielectric layer 124b, which are disposed in the plug-contacting region 104. The steps of patterning the second dielectric layer 124b are similar to the steps of forming the contact hole, but different photo masks are used, so descriptions of the steps are omitted. Thereafter, a metal layer 126, such as aluminum (Al), is formed to cover surfaces of the contact plug 128, the body layer 120 and the source regions 122.

As shown in FIG. 9 and the step 214 of FIG. 10, furthermore, another patterning process can be carried out to remove portions of the metal layer 126 to form at least a gate trace 126a and at least a source trace 126b, and thus to form the power device of the present invention. The gate trace 126a covers the contact plug 128 to control the gate voltage, and the source trace 126b directly contacts and covers each source region 122 disposed in the cell region 102 to control the source voltage.

In other embodiments of the present invention, performing order of the above-mentioned processes or steps can be adjusted as required. For example, the implantation process for the body layer 120 can be performed before forming the trench 116 in one embodiment, or before forming the gate insulating layer 132 in another embodiment. Moreover, the above-mentioned conductive types or dopant species can also be adjusted as required. For example, the semiconductor layer 114 can be a P-type light doped epitaxial silicon layer, the body layer 120 can be an N-type body layer, and the source regions 122 can be a P-type heavy doped region for forming a P-type MOS.

Figure 11:
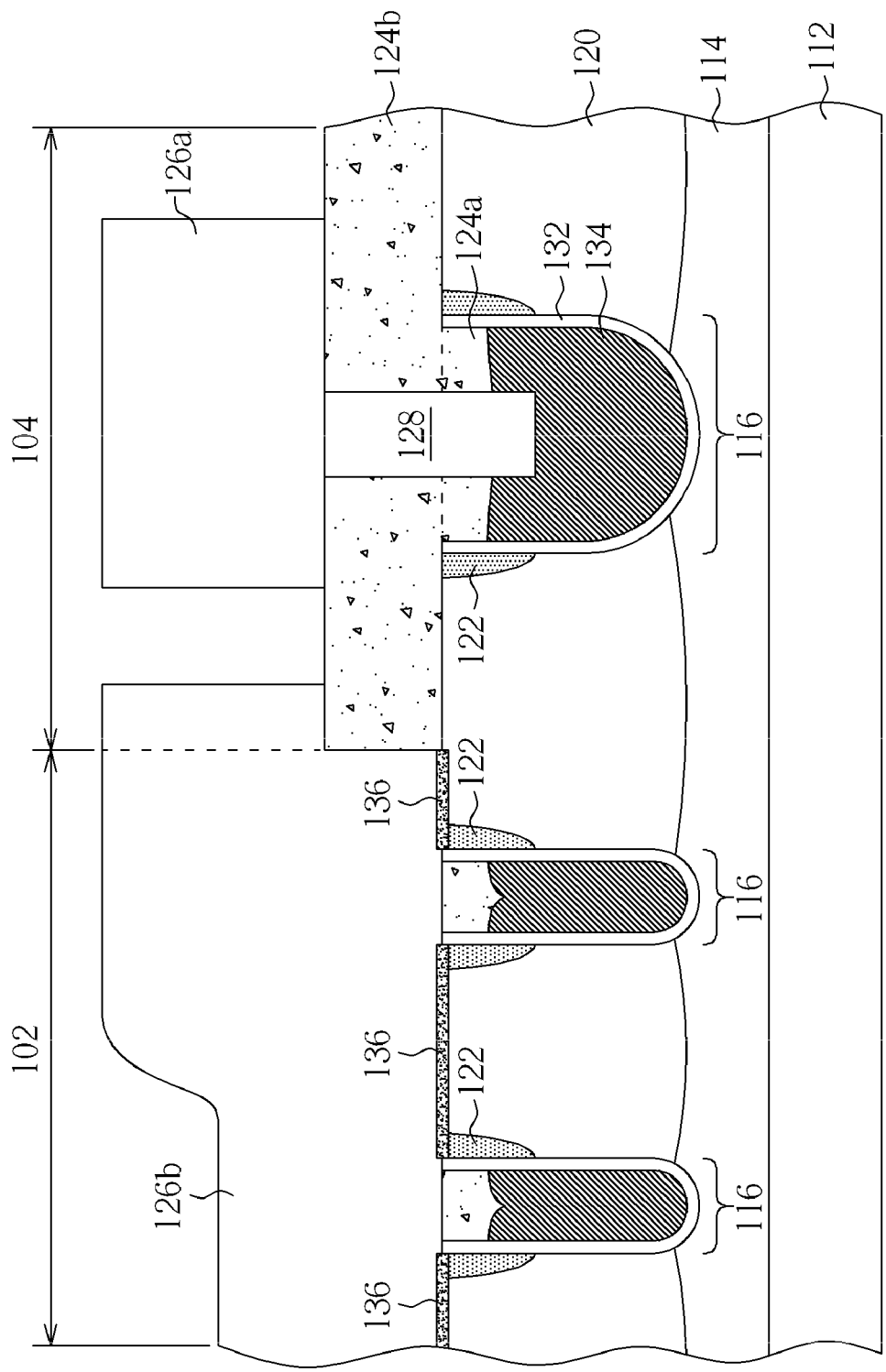
FIG. 11 is a schematic diagram illustrating a method for forming a power device according to another preferred embodiment of the present invention.

Moreover, please refer to FIG. 11, which is a schematic diagram illustrating a method for forming a power device according to another preferred embodiment of the present invention. As shown in FIG. 11, the present invention can further include the step of forming silicide 136, so as to form a power device having silicide 136. The silicide 136 can reduce the contact resistance between the source trace 126b and silicon-containing materials, and can also function as the buffer layer or barrier layer between the source trace 126b and silicon-containing materials to reduce electro-migrations of metal materials. The forming order and to forming position of the silicide 136 can be adjusted according to the product designs or the characteristics of processes in the present invention. In one embodiment, the silicide 136 can be formed on the exposed source regions 122 and the exposed body layer 120 after the pattern-transferring process of removing portions of the second dielectric layer 124b shown in FIG. 8, and before the step of forming the metal layer 126. In another embodiment, the silicide 136 can be formed on silicon-containing materials after the planarization process shown in FIG. 5.

Since the source trace 126b can directly contact and cover each the source region 122 of the transistors in the present invention, the source trace 126b can be not only the first metal layer (bottom metal layer) of the interconnection, but also the contact elements between active devices and the interconnection. Since the traditional contact elements, the source contact plug, can be omitted, the traditional design rules are no longer necessary for the source contact plug in the present invention. In addition to the contact plug, since the tilted ion implantation process can form the source regions 122 having sharp shapes in the present invention, the distance between the adjacent portions of the trench 116 can be effectively decreased, and the channel density and the device integration of the trench power MOSFET can be therefore increased.

The method of forming a power device in the present invention not only can provide the power MOSFET with high channel density, but also has advantages of lower process complexity and higher process accuracy. For instance, since portions of the conductive material 134 disposed in the trench 116 above the predetermined depth D are removed by the etching process, the heavy doped region 106 can be accurately formed and highly concentrated on partial sidewalls of the trench 116 by the subsequently performed tilted ion implantation process.

The present invention can use only one CMP process to remove the unnecessary portions of the first dielectric layer 124a, the gate insulating layer 132, the body layer 120 and the heavy doped region 106 all at once. According to the above-mentioned embodiments, merely five pattern-transferring processes (five masks) are needed to form the power device of the present invention. One of the masks is the photo mask used to form the trench 116 as shown in FIG. 2; one of the masks is the implanting mask used to form the body layer 120 as shown in FIG. 3; one of the masks is the photo mask used to form the contact plug 128 as shown in FIG. 7; one of the masks is the photo mask used to remove the second dielectric layer 124b disposed in the cell region 102 as shown in FIG. 8; and one of the masks is the photo mask used to form the gate trace 126a and the source trace 126b as shown in FIG. 9.

Those skilled in the art will readily observe that numerous modifications and alterations of the device and method may be made while retaining the teachings of the invention.

What is claimed is:

1. A method of forming a power device, comprising:
   providing a substrate, a semiconductor layer disposed on the substrate, a gate insulating layer covering the semiconductor layer, and a conductive material, the semiconductor layer having a trench, the conductive material being disposed in the trench, the substrate defining a cell region and a plug-contacting region, wherein the trench of the semiconductor layer extends from the cell region into the plug-contacting region, and a top surface of the conductive material is disposed in a predetermined depth of the trench;
   performing an ion implantation process to form a body layer in the semiconductor layer;
   performing at least a tilted ion implantation process to form at least a heavy doped region, which contacts a sidewall of the trench and is disposed in the semiconductor layer;
   forming a first dielectric layer overall on the substrate to fill the trench;
   performing a chemical mechanical polishing (CMP) process, until exposing the body layer disposed under the heavy doped region, so as to turn the heavy doped region, which contacts the sidewall of the trench, into a plurality of source regions;
   forming a patterned dielectric layer in the plug-contacting region;
   forming at least a contact plug, which penetrates through the patterned dielectric layer and the first dielectric layer, and is electrically connected to the conductive material in the trench; and
   forming at least a gate trace and at least a source trace, wherein the gate trace covers the contact plug, and the source trace covers the source regions disposed in the cell region.

2. The method of claim 1, wherein the step of forming the conductive material comprises:

depositing the conductive material disposed on the gate insulating layer to fill the trench; and performing an etching back process on the conductive material, until the top surface of the conductive material reaches the predetermined depth of the trench, and portions of the gate insulating layer are exposed.

3. The method of claim 2, wherein the predetermined depth is in a range between 0.4 micrometer and 0.5 micrometer for the etching back process.

4. The method of claim 1, wherein the ion implantation process of forming the body layer utilizes an implanting mask to cover portions of the semiconductor layer surrounding both the cell region and the plug-contacting region, and to expose portions of the semiconductor layer disposed within the cell region and portions of the semiconductor layer disposed within the plug-contacting region.

5. The method of claim 1, wherein the step of forming the patterned dielectric layer and the contact plug comprises:

forming a second dielectric layer overall to cover surfaces of the body layer, the first dielectric layer and the source regions;

forming the contact plug, which penetrates through the second dielectric layer and the first dielectric layer in the plug-contacting region, and is electrically connected to the conductive material in the trench; and removing portions of the second dielectric layer disposed in the cell region to expose the source regions and the body layer disposed in the cell region.

6. The method of claim 1, wherein the step of forming the gate trace and the source trace comprises:

forming a metal layer overall to cover surfaces of the contact plug, the body layer and the source regions; and removing portions of the metal layer to form and separate the gate trace and the source trace.

7. The method of claim 1, wherein no anneal process is performed after the tilted ion implantation process forms the heavy doped region.

8. The method of claim 1, wherein the semiconductor layer is an N-type light doped epitaxial silicon layer.

9. The method of claim 1, wherein the conductive material comprises doped poly-silicon.

10. The method of claim 1, wherein the body layer is a P-type body layer.

11. The method of claim 1, wherein the heavy doped region is an N-type heavy doped region.

* * * * *